Feb. 9, 1971 T. D. McGEE 3,561,106

BARRIER LAYER CIRCUIT ELEMENT AND METHOD OF FORMING

Filed July 3, 1968

INVENTOR:
THOMAS D. McGEE
BY
Dawson, Tilton, Fallon & Lungmus
ATT'YS

United States Patent Office 3,561,106
Patented Feb. 9, 1971

3,561,106

BARRIER LAYER CIRCUIT ELEMENT AND METHOD OF FORMING

Thomas D. McGee, Ames, Iowa, assignor to Iowa State University Research Foundation, Inc., Ames, Iowa, a corporation of Iowa Filed July 3, 1968, Ser. No. 742,242
Int. Cl. H01l 7/02
U.S. Cl. 29—576 1 Claim

ABSTRACT OF THE DISCLOSURE

A ferroelectric crystal such as barium titanate, is uniformly doped to produce an n-type semconductor. Electron-acceptor ions are then added to the surface of the crystal to produce a surface barrier layer wherein the electron-donor ions of the original n-type semiconductor crystal are exactly compensated by the added electronic acceptor ions. The resistivity of the compensated layer is very high; and the layer defines a junction of high dielectric constant capable of storing a relatively large electric charge thus producing a capacitor. This barrier layer may also serve as a diode for rectification, or a temperature-sensitive resistor, or a current- or voltage-sensitive resistor. In one embodiment, the acceptor ions are provided in the form of a metallic oxide and silver electrodes contact the crystal. When the combination is fired in a suitable atmosphere, the oxide is reduced and the metal diffuses into the n-type crystal to produce the compensated layer. Thus, an electronic element is provided in a single process step with the silver electrodes alloying with the reduced oxide on the surface of the crystal.

BACKGROUND

The present invention relates to solid state electronic devices; more particularly, it relates to a barrier layer device which may serve as a high storage capacity electrical condenser when made from a ferroelectric crystal. This barrier layer may also serve as a temperature-sensitive resistor, voltage-sensitive resistor, rectifier or a combination of these depending on the barrier-producing ions and the properties of the base crystal.

A ferroelectric crystal such as barium titanate in its pure crystalline form is a poor conductor of electricity; that is, it is an insulator. An early worker in the development of semiconductor technology noted that the barium titanate crystal can be reduced in a hydrogen atmosphere to produce an n-type semiconductor (that is, one having electron donors) wherein the quadrivalent titanium is reduced to trivalent titanium.

In the earlier method, after a pellet is reduced by firing in a hydrogen atmosphere, the sides of the pellet are contacted with silver electrodes and the surface of the pellet is then oxidized to produce a surface barrier layer capable of storing electric charge. Thus, the usual manufacturing requires firing in air, reduction with hydrogen, contacting with silver electrodes, and re-oxidation.

A subsequent worker suggested adding a trivalent metallic ion to proxy for the barium ion to reduce the quadrivalent titanium and thus produce an n-type semiconductor.

In this method, which is commonly referred to as the controlled valency principle, ions are added to cause spontaneous reduction of the titanium when fired in air or nitrogen. It is then necessary only to oxidize while engaging the electrodes. In this particular application, the selection of the materials for the electrode is extremely important and found to be very critical for successful operation.

These barrier layer devices have very high capacity for storing charge, but they have low breakdown voltages because of the fairly high conductivity of the barrier layer. Thus, it is desirable to produce a barrier layer device in which the conductivity of the barrier layer is reduced.

SUMMARY

The present invention contemplates doping the surface of an n-type semiconductor with ions to produce a surface barrier layer of high resistivity wherein electron donors of the original n-type semiconductor crystal are exactly compensated by added electron acceptors. This produces a very narrow region or layer of high resistivity which is capable of storing large amounts of charge thereby producing a high capacity electrical condenser. Since the resistivity of the barrier layer is very high, the breakdown voltage of the device is correspondingly high. Further, in one specific embodiment, the device can be produced in a single step of firing thereby producing a greatly improved device in a much simplified manner.

Other features and advantages of the instant invention will be obvious to persons skilled in the art from the following detailed description accompanied by the attached drawing.

DRAWING

DETAILED DESCRIPTION

The barium titanate crystal in its monocrystalline and polycrystalline forms is a ferroelectric crystal, that is, the application of an electric field to the crystal will displace ions within the crystal and distort its symmetry to produce a net dipole moment which causes the crystal to become polarized. It will be appreciated that the present invention may successfully be utilized with any ferroelectric crystal to produce a high storage capacitor. For rectifier, temperature-sensitive resistor, and voltage-sensitive resistor applications the crystal need not be ferroelectric.

Figure 1:
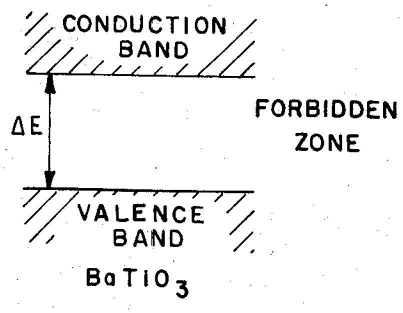
FIGS. 1–4 are schematic conduction/valence band diagrams illustrating the inventive concept.

As is commonly known, pure barium titanate in both the monocrystalline and polycrystalline form is an insulator. Titanium appears only in its quadrivalent state. In terms of a schematic conduction/valence band diagram, FIG. 1 illustrates the relatively large energy gap of the forbidden zone which separates the conduction band from the valence band. With no free electrons in the conduction band and a large energy gap, $\Delta E$, in which there are no available energy bands capable of supporting the electron, a large amount of energy is required to move even a single electron from the valence band to the conduction band; and thus, pure barium titanate remains an insulator.

It is noted that the exact electronic conduction mechanism in ceramic conductors is not known with the certitude of scientific law; and I do not intend to be bound by the theoretical explanation of conduction that follows, it being understood that the drawing is for the purposes of illustrating the concept. For example, it is possible that electrons are localized in the region of oxygen vacancies rather than on trivalent titanium ions.

Figure 2:
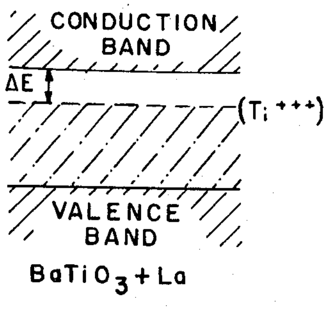

When lanthanum (a trivalent metal) is added to the barium titanate and the mixture fired in hydrogen, the quadrivalent titanium is reduced to a trivalent titanium ion, and the energy gap, $\Delta E$, is significantly reduced as illustrated in FIG. 2. With the energy gap of the forbidden zone thus reduced, less energy is required to produce conducting electrons, and the crystal becomes an n-type semiconductor. It will be appreciated that the n-type semiconductor has appreciably more electrons available than the pure monocrystalline or polycrystalline form, and these are commonly referred to as electron donors.

As illustrated in FIG. 2, the horizontal dashed line in the forbidden zone represents the energy state of a trivalent titanium ion. In the pure barium titanate crystal, titanium is present only in its quadrivalent ionic state which causes the previously explained wide energy gap. With the added lanthanum reducing the titanium from this quadrivalent to trivalent ionic state, the energy gap defining the actual forbidden zone is reduced and the crystal becomes a semiconductor with electron donors. The function of the lanthanum (namely, to produce an n-type semiconductor) could, of course, be equally well satisfied by other trivalent metals such as gadolinium, as described in the particular example below.

Figure 3:
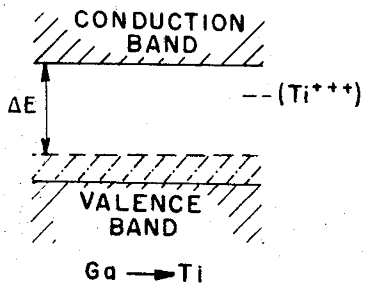

Broadly, the present invention seeks to tie up or bind tightly by means of chemical forces the electron donors over a very narrow region or barrier layer in the n-type semiconductor crystal just described. One method of binding these electron donors is to add a trivalent ion on the surface of the n-type semiconductor crystal such that the donor electrons are tightly bound and not available to move (i.e. conduct) as in the case of the trivalent titanium ion. This situation is schematically illustrated in the diagram of FIG. 3 in which gallium proxies for titanium in the compensated barrier layer. The chemical equation may be written as follows:

$$Ba_{(1-x)}La_xTi_x^{+3}Ti_{(1-x)}^{+4}O_3 + xGa^{+3} \longrightarrow Ba_{(1-x)}La_xGa_xTi^{+4}O_3$$

Thus, there is produced a very narrow surface barrier layer wherein the energy state equivalent to the trivalent titanium ion is unoccupied, and the energy gap of the crystal in this region is correspondingly greater. At least in this very narrow surface barrier layer, the crystal is not a semiconductor, but very close to an insulator, as was the original pure crystal. This is schematically illustrated by the correspondingly greater energy gap, $\Delta E$ in FIG. 3. Thus, there is produced a region of high resistivity capable of storing a large amount of electric charge so that when conducting leads are connected to either side of the barrier layer, an electrical capacitor or condenser is formed. By controlling the degree of compensation and by using one or more different compensating ions, the resistance can be controlled for other applications such as rectifier, temperature-sensitive resistors, voltage-sensitive resistors, etc.

Figure 4:
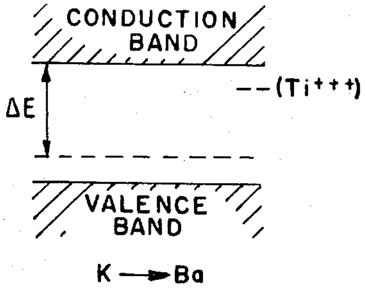

Another way to compensate for the added trivalent lanthanum donors is the n-type semiconductor crystal is to add a monovalent ion, such as potassium, to proxy for the barium ion to produce electrical neutrality in the surface barrier layer wherein the donor electrons are again tightly bound throughout the region. This is schematically illustrated in FIG. 4 wherein potassium proxys for the barium again increasing the energy gap between the conduction band and the valence band by changing the titanium from its trivalent ionic state to its quadrivalent ionic state thereby leaving the trivalent energy state unoccupied and increasing the energy gap as illustrated in FIG. 4. In this example, the charge neutrality of the crystal may be expressed as follows:

$$Ba_{(1-2x)}^{++}K_x^{+}La_x^{+++}Ti^{++++}O_3^{--}$$

where $x$ represents the amount present in moles.

Figure 5:
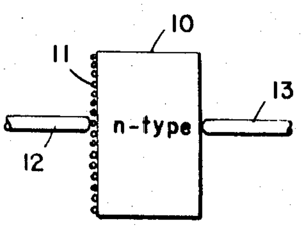
FIG. 5 is a schematic illustration of a preferred embodiment of the present invention.
Figure 6:
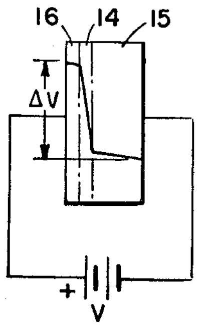
FIG. 6 shows the voltage drop across the barrier junction for a given applied voltage.

Referring now to FIG. 5, there is illustrated an embodiment of the invention wherein the n-type semiconductor crystal of barium titanate doped with lanthanum is designated 10, and at one surface of the crystal, powderd gallium oxide 11 contacts its surface. One silver electrode 12 contacts the gallium oxide 11, and a second silver electrode 13 contacts the opposite side of the crystal 10. The material is then placed in a suitable controlled atmosphere and fired; the galium oxide diffuses into the crystal to produce a narrow surface barrier region in which the galium proxys for trivalent titanium and metallic gallium is reduced from the oxide on the surface. The silver electrode 12 aloys to the gallium for a solid connection, and there will be defined a layer near the surface of the crystal in which the added gallium ions substituting for the trivalent titanium ions will be exactly equal. This region is designated 14 in FIG. 6 which is a schematic illustration of the produced crystal. To the right of the narrow barrier region 14 is the remainder of the crystal 15 which, of course, remains an n-type semiconductor. To the left of the barrier layer 14 is the remainder of the low resistivity caused by the metallic gallium, and this region is no more than a very narrow surface region designated 16. If an applied voltage V were applied across the crystal, as illustrated, substantially the entire voltage drop V would appear across the barrier region 14 due to its high resistivity. This will be a rectifying diode. When both surfaces are doped with gallium two diodes with two barriers, 14, are produced. These act as two condensors in series giving a high storage capacitor.

It will be appreciated that in selecting the foreign ion or ions which will diffuse into the host crystal lattice, there are a number of parameters which control the solid state solution of the foreign ion. Among the most significant are that the ionic size of the substituting and host ions must be within 15% of each other and that the valence would be suitable to maintain charge neutrality. (In this example trivalent gallium was chosen to substitute for the trivalent titanium). It will also be appreciated that controlling the oxygen pressure during firing will change the sequence of events by controlling the diffusion rate and the solubility so that ions can be placed in the desired position and metal produced in the desired location.

Having thus described specific embodiments of the inventive method and device, it will be obvious that certain elements may be substituted for those which have been described with like results; that the crystal may be monocrystalline or polycrystalline; and it is therefore intended that all such equivalents be covered as they are embraced within the spirit and scope of the appended claim.

I claim:

1. A method of producing a solid state electronic element comprising: providing a barium titanate host crystal doped with a substance selected from the group of gadolinium and lanthanum to produce an n-type semiconductor with trivalent ions; adding galium oxide to one surface of the crystal; capable of contacting a surface of the host crystal with a silver electrode; contacting the added gallium oxide with a silver electrode; then firing the material to reduce the gallium oxide and to produce a narrow region in the host crystal in which gallium is a proxy for barium in the host crystal and alloys with the silver electrode contacting it, the proxying gallium producing a surface barier layer of high resistivity wherein electron donors of the host crystal are compensated by the added electron acceptors.

References Cited

UNITED STATES PATENTS

| | | | |
|---|---|---|---|
| 3,195,030 | 7/1965 | Herczog et al. | 317—258 |
| 3,268,783 | 8/1966 | Saburi | 317—230 |
| 3,299,332 | 1/1967 | Saburi | 317—237 |
| 3,351,500 | 11/1967 | Khouri | 317—230X |
| 3,419,758 | 12/1968 | Hayakawa et al. | 317—230 |
| 3,426,249 | 2/1969 | Smyth | 317—230 |
| 3,426,251 | 2/1969 | Prokopowicz | 317—230 |

JAMES D. KALLAM, Primary Examiner

U.S. Cl. X.R.

317—230, 238